(12) United States Patent
Wang

(10) Patent No.: US 10,685,917 B2
(45) Date of Patent: Jun. 16, 2020

(54) SEMICONDUCTOR DEVICE AND MANUFACTURE METHOD OF THE SAME

(71) Applicant: China Wafer Level CSP Co., Ltd., Suzhou, Jiangsu (CN)

(72) Inventor: Zhiqi Wang, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 16/209,715

(22) Filed: Dec. 4, 2018

(65) Prior Publication Data

US 2019/0206801 A1    Jul. 4, 2019

(30) Foreign Application Priority Data

Dec. 29, 2017 (CN) ............ 2017 1 1469225
Dec. 29, 2017 (CN) ............ 2017 2 1891851 U

(51) Int. Cl.
*H01L 23/532* (2006.01)
*H01L 21/02* (2006.01)
*H01L 23/00* (2006.01)
*H01L 21/768* (2006.01)

(52) U.S. Cl.
CPC .... *H01L 23/53295* (2013.01); *H01L 21/0226* (2013.01); *H01L 21/02227* (2013.01); *H01L 21/76898* (2013.01); *H01L 24/09* (2013.01); *H01L 24/17* (2013.01)

(58) Field of Classification Search
CPC ........... H01L 23/53295; H01L 21/0226; H01L 21/02227; H01L 24/09; H01L 24/17; H01L 2225/06541; H01L 2224/48227; H01L 21/76898; H01L 23/49827
See application file for complete search history.

(56) References Cited

U.S. PATENT DOCUMENTS

| 8,669,642 | B2* | 3/2014 | Son | H01L 21/76898 257/621 |
| 2009/0065906 | A1* | 3/2009 | Tanida | H01L 21/76898 257/621 |

\* cited by examiner

*Primary Examiner* — Jasmine J Clark
(74) *Attorney, Agent, or Firm* — Wolf, Greenfield & Sacks, P.C.

(57) ABSTRACT

A semiconductor device and a manufacture method of the semiconductor device are provided. In the semiconductor device, a back surface of a substrate is covered with a first insulating layer, where the first insulating layer covers the bottom and the sidewall of a through hole and the back surface of the substrate outside the through hole. The first insulating layer outside the through hole is covered with a second insulating layer. When etching the first insulating layer at the bottom of the through hole, although an etching speed for a region outside the through hole is greater than an etching speed for the bottom of the through hole, the first insulating layer outside the through hole is protected from being over-etched by the second insulating layer, which improves reliability of the device.

13 Claims, 4 Drawing Sheets

SEMICONDUCTOR DEVICE AND MANUFACTURE METHOD OF THE SAME

CROSS REFERENCE OF RELATED APPLICATION

The present application claims priority to Chinese Patent Application No. 201711469225.1, titled "SEMICONDUCTOR DEVICE AND MANUFACTURE METHOD OF THE SAME", filed on Dec. 29, 2017 with the the Chinese Patent Office, and Chinese Patent Application No. 201721891851.5, titled "SEMICONDUCTOR DEVICE", filed on Dec. 29, 2017 with the Chinese Patent Office, both of which are incorporated herein by reference in their entireties.

FIELD

The present disclosure relates to the technical field of semiconductor, and in particular to a semiconductor device and a manufacture method of the semiconductor device.

BACKGROUND

Semiconductor devices are main functional units in an integrated circuit, and various semiconductor devices are essential components for achieving specific functions of the integrated circuit. In order to connect the semiconductor device to an external circuit, normally a through hole is formed on a back surface of a substrate of the semiconductor device to expose a contact pad on a front surface of the substrate. It is required to form an insulating layer in the through hole and a rewiring layer on a surface of the insulating layer. The rewiring layer is connected to the contact pad, and extends to outside of the through hole. The rewiring layer outside of the through hole is connected with a connecting end for connecting with the external circuit.

In the conventional technology, when manufacturing a semiconductor component, the insulating layer is formed in the through hole. The insulating layer at the bottom of the though hole is required to be removed by an etching process so as to expose the contact pad. However, an over-etching problem is prone to occur in the conventional semiconductor devices, resulting in a poor reliability of the semiconductor devices.

SUMMARY

In order to solve the above problems, a semiconductor device and a manufacture method of the semiconductor device is provided according to the technical solution of the present disclosure to improve reliability of a semiconductor device.

The technical solution is described as follows.

A manufacture method of a semiconductor device, includes: providing a substrate, where the substrate has a front surface and a back surface opposite to each other, a functional unit and a contact pad connected to the functional unit are arranged on the front surface; forming a through hole on the back surface of the substrate, where the contact pad is exposed through the through hole, and the through hole is a straight hole; forming a first insulating layer, where the first insulating layer covers the bottom and all sidewall of the through hole and the back surface of the substrate outside the through hole; forming a second insulating layer, where the second insulting layer covers the first insulating layer outside the through hole; and removing the first insulating layer at the bottom of the through hole by an etching process to expose the contact pad.

In an embodiment of the above manufacture method, the first insulating layer is formed by a first deposition process, and the second insulating layer is formed by a second deposition process.

In an embodiment of the above manufacture method, a coverage rate of the first deposition process is greater than a coverage rate of the second deposition process.

In an embodiment of the above manufacture method, the first insulating layer is a silicon dioxide layer, and the second insulating layer is a silicon nitride layer.

In an embodiment of the above manufacture method, the through hole is a circular hole or a square hole.

In an embodiment of the above manufacture method, the first insulating layer is etched by a dry etching process or a wet etching process.

In an embodiment of the above manufacture method, the substrate is a wafer, where the wafer includes multiple chip regions, a cut groove is provided between adjacent chip regions, the functional unit and the contact pad are arranged in each of the chip regions.

The manufacture method further includes: forming a rewiring layer that covers the second insulating layer after performing the etching process, where the rewiring layer is connected to the contact pad at the bottom of the through hole; forming a solder mask on a surface of the rewiring layer, where the solder mask has an opening in a region outside the through hole, to expose the rewiring layer; forming a connecting end at the opening, where the connecting end is connected to the rewiring layer and is for connecting to an external circuit; and cutting the wafer along the cut groove to form multiple individual semiconductor devices.

A semiconductor device is further provided according to the present disclosure, which includes: a substrate, where the substrate includes a front surface and a back surface opposite to each other, a functional unit and a contact pad connected to the functional unit are arranged on the front surface; a through hole arranged on the back surface of the substrate, where the contact pad is exposed through the through hole, and the through hole is a straight hole; a first insulating layer that covers the back surface of the substrate and covers all sidewall of the through hole, where the contact pad at the bottom of the through hole is exposed from the first insulating layer; a second insulating layer that covers the first insulating layer outside the through hole; a rewiring layer that covers the second insulating layer, where the rewiring layer is connected to the contact pad at the bottom of the through hole; a solder mask that covers the rewiring layer, where the solder mask has an opening in a region outside the through hole, and the rewiring layer is exposed through the opening; and a connecting end arranged at the opening, where the connecting end is connected to the rewiring layer and is for connecting to an external circuit.

In an embodiment of the above semiconductor device, the first insulating layer is forming by a first deposition process and the second insulating layer is formed by a second deposition process.

In an embodiment of the above semiconductor device, a coverage rate of the first deposition process is greater than a coverage rate of the second deposition process.

In an embodiment of the above semiconductor device, the first insulating layer is a silicon dioxide layer, and the second insulating layer is a silicon nitride layer.

In an embodiment of the above semiconductor device, the through hole is a circular hole or a square hole.

In the above semiconductor device, the semiconductor device is a photo-sensitive chip, an Application Specific Integrated Circuit (ASIC) chip or a micro-electromechanical system (MEMS) chip.

In the semiconductor device and the manufacture method of the semiconductor device provided according to the technical solution of the present disclosure, a back surface of a substrate is covered with a first insulating layer, and the first insulating layer covers the bottom and the sidewall of the through hole and the back surface of the substrate outside the through hole. The first insulating layer outside the through hole is covered with the second insulating layer. When etching the first insulating layer at the bottom of the through hole, although an etching speed for a region outside the through hole is greater than an etching speed for the bottom of the through hole, the first insulating layer outside the through hole can be protected from being over-etched by the second insulating layer, which improves reliability of the device.

BRIEF DESCRIPTION OF THE DRAWINGS

In order to more clearly illustrate technical solutions of the embodiment of the present disclosure or the conventional technologies, the drawings to be used in the description of the embodiments or the conventional technology are briefly described below. Apparently, the drawings only describe some embodiments of the present disclosure, and other drawings may be obtained by those skilled in the art based on these drawings without any creative work.

DETAILED DESCRIPTION

Figure 1:
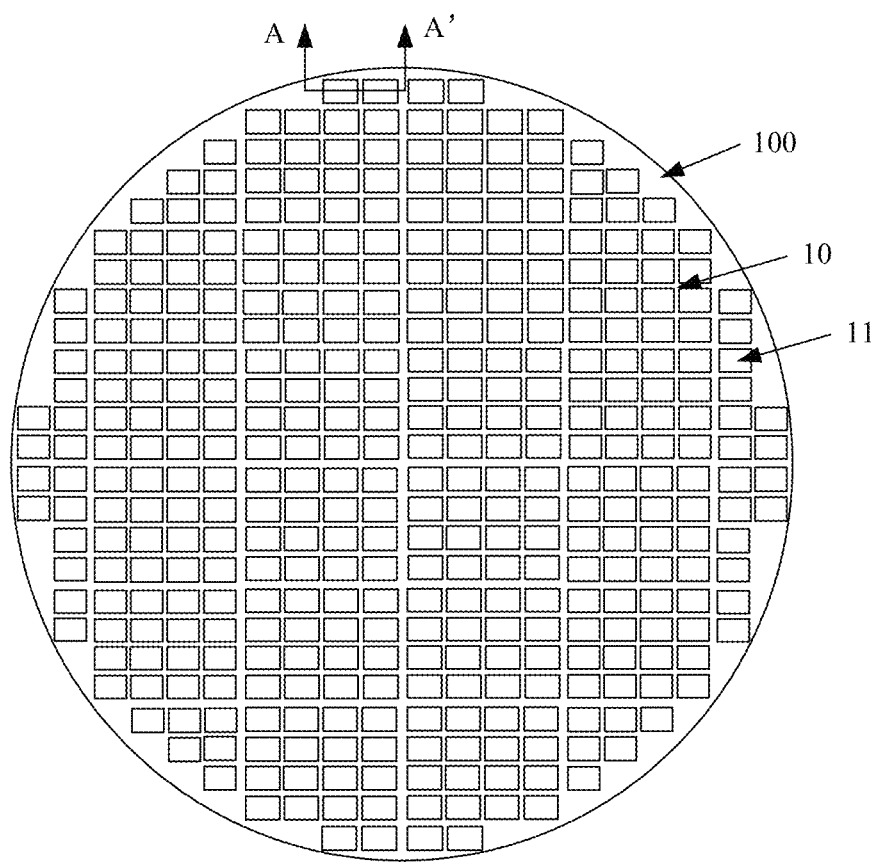
FIGS. 1 to 10 are schematic diagrams showing a procedure of a manufacture method of a semiconductor device according to embodiments of the present disclosure.

Hereinafter, the technical solutions according to the embodiments of the present disclosure will be described clearly and completely in conjunction with the drawings in the embodiment of the present disclosure. Apparently, the described embodiments are only a few rather than all of embodiments of the present disclosure. Any other embodiments obtained by those skilled in the art based on the embodiments of the present disclosure without any creative work fall within the scope of protection of the disclosure.

In a semiconductor device, a through hole normally has a small aperture. When forming an insulating layer by a deposition process, due to a coverage rate, the formed insulating layer has a large thickness at a part outside the through hole, has a less thickness at a part on the sidewall of the through hole and has a least thickness at a part at the bottom of the through hole. In a case where the through hole is a straight hole, the problem is particularly serious. The coverage rate refers to a ratio of a thickness of the insulating layer at a thinnest position to a thickness of the insulating layer at a thickest position.

When etching the insulating layer, generally the entire insulation layer is etched. A directional etching method is adopted to etch the insulating layer top-down, with a back surface of a substrate of the semiconductor device being upward. When etching the insulating layer at the bottom of the through hole, the insulating layer on the sidewall and the bottom of the through hole is also etched. A desired etching result is that the insulating layer at the bottom of the through hole is completely etched, while the insulating layer on the sidewall of the through hole and outside the through hole are only partially etched. However, due to difficult control of the etching, in order to preserve a complete insulating layer on the sidewall of the through hole and on the back surface of the substrate outside the through hole, one way is to improve the coverage rate. That is to increase the ratio of the thickness of the insulating layer at the thinnest position to the thickness of the insulating layer at the thickest position so as to increase the thickness of the insulting layer on the sidewall of the through hole. In this case, the thickness of the insulating layer at the bottom of the through hole is also increased, thereby increasing an etching time. In this case, an etching speed for the outside of the through hole may be much greater than that for the bottom of the through hole, so that over-etching is prone to occur in the insulating layer outside the through hole, thus affecting the reliability of the semiconductor device. Another way is to reduce the coverage rate, thereby decrease the thickness of the insulating layer at the bottom of the through hole, and thus shortening the etching time. In this case, the thickness of the insulating layer on the sidewall of the through hole is also decreased, thereby resulting in incomplete cover of the sidewall of the through hole by the insulating layer.

it is desired to solve by those skilled in the art the problem of how to balance the contradiction between the etching time, the etching speed, the thickness of the insulating layer and the over-etching, i.e., how to fully etch the insulating layer at the bottom of the through hole while ensuring a completeness of the insulating layer on the sidewall of the through hole and outside the through hole, so as to ensure a high reliability of the semiconductor device.

A second insulating layer is added on a surface of a first insulating layer in the embodiment of the present disclosure. The first insulating layer is formed under a condition of a high coverage rate. In this case, the first insulating layer fully covers the surface of sidewall of the through hole and has a large thickness. In the etching process, although the etching time becomes longer due to an increase of the thickness of the first insulating layer at the bottom of the through hole, which results in a higher etching speed for the outside of the through hole, the first insulating layer is protected from being etched by the second insulating layer, thereby preventing the insulating layer outside the through hole from being over-etched. Since the etching is performed top-down, the longer etching time makes the etching speed for the first insulating layer at the bottom of the through hole which is horizontally extended is much greater than that for the first insulating layer on the sidewall of the through hole which is vertically extended, which prevents the first insulating layer on the sidewall of the through hole from being over-etched. Hence, with the technical solution provided in the embodiment of the present disclosure, the first insulating layer on the sidewall of the through hole and outside the through hole is prevented from being over-etched while ensuring fully etching of the first insulating layer at the bottom of the through hole, thereby improving the reliability of the semiconductor device.

In order to make the above purpose, features advantages of the present disclosure more clear and understandable, the technical solution will be described in detail in conjunction with the drawings and the specific embodiment of the present disclosure.

Reference is made to FIGS. 1 to 10, which are schematic diagrams showing a procedure of a manufacture method of a semiconductor device according to embodiments of the present disclosure. The manufacture method includes the following steps S11 to S15.

Figure 2:
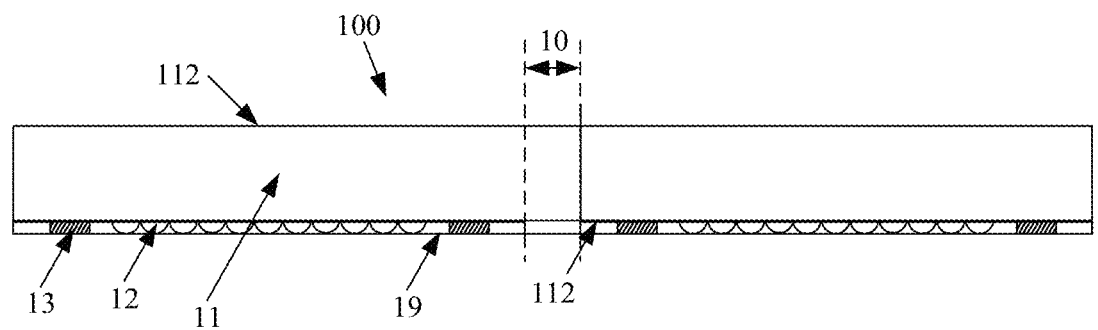

In step S11, as shown in FIG. 1 and FIG. 2, a substrate 100 is provided. FIG. 1 is a top view of a front face of the substrate, and FIG. 2 is a section view of FIG. 1 in a direction of A-A'.

The substrate 100 has a front surface 111 and a back surface 112 opposite to each other. A functional unit 12 and a contact pad 13 connected to the functional unit 12 are arranged on the front surface 111.

A surface of the substrate 100 is covered with a protective layer 19 so as to avoid damage to the functional unit 12 on the front surface 111 and ensure that a function side of the semiconductor device formed later has a good smoothness, to be better attached to another component.

Figure 3:
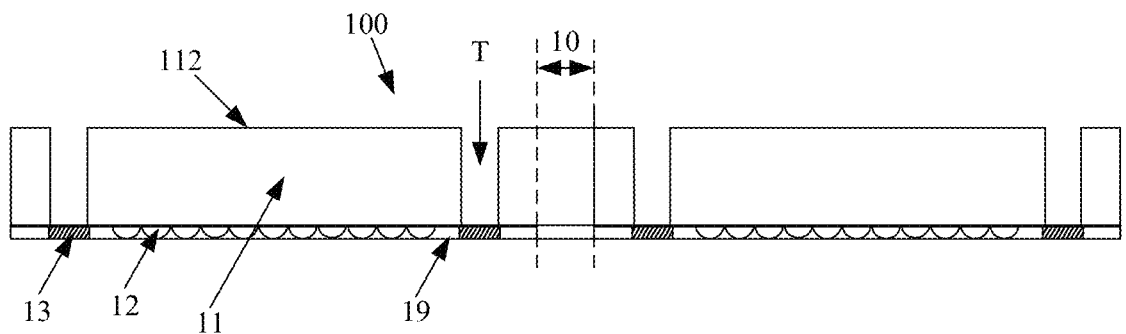

In step S12, as shown in FIG. 3, a through hole T is formed on the back surface 112 of the substrate 100, where the contact pad 13 is exposed through the through hole T.

The substrate 100 is placed such that the back surface 112 is upward. Before forming the through hole, the back surface of the substrate 100 may be thinned so that a final semiconductor device has a small thickness. In order to greatly thin the substrate 100 and ensure a good mechanical strength of the final semiconductor device, the substrate 100 is fixed on a horizontal supporting stage, to thin the substrate to a larger extent than that in the conventional technology and then form an enhancement layer on the thinned back surface, which is not shown in Figures, where a hardness of the enhancement layer is greater than the hardness of the substrate 100.

The through hole T is formed on the substrate 100 having the enhancement layer. In a case of arranging the enhancement layer, the enhancement layer covers the back surface of the substrate 100 outside the though hole in the final semiconductor device and the part of the first insulating layer 14 outside the through hole covers the enhancement layer. The through hole T may be formed by a laser drilling process or an etching process. In an embodiment, the through hole T is a straight hole having a vertical sidewall. A width of the straight through hole T is invariant in a direction perpendicular to the substrate 100. The straight through hole T may be a square hole or a circular hole. In the embodiments of the present disclosure, the through hole is preferably formed by a dry etching process. For example, a plasma etching process may be adopted, which has a good etching directivity of top-down.

Figure 4:
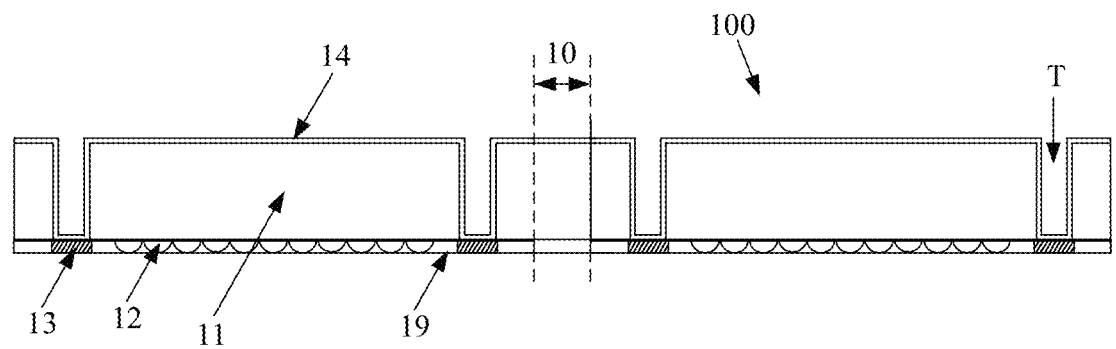

In step S13, as shown in FIG. 4, the first insulating layer 14 is formed, where the first insulating layer 14 covers the bottom and the sidewall of the through hole T and the back surface of the substrate 100 outside the through hole T.

The first insulating layer 14 may be formed by a deposition process. In the embodiment of the present disclosure, the deposition process includes but is not limited to the plasma-enhanced chemical vapor deposition (PECD) process and the atomic layer deposition (ALD) process. A high coverage rate is used in the step to increase a ratio of a thickness of the first insulating layer at a thinnest position to a thickness of the first insulating layer at a thickest position, so as to increase a thickness of the first insulating layer covering the bottom and the sidewall of the through hole.

The first insulating layer 14 may be a silicon dioxide layer. Generally, the substrate 100 is a silicon substrate. In this case, the first insulating layer 14 may be directly formed by thermal oxidation.

Figure 5:
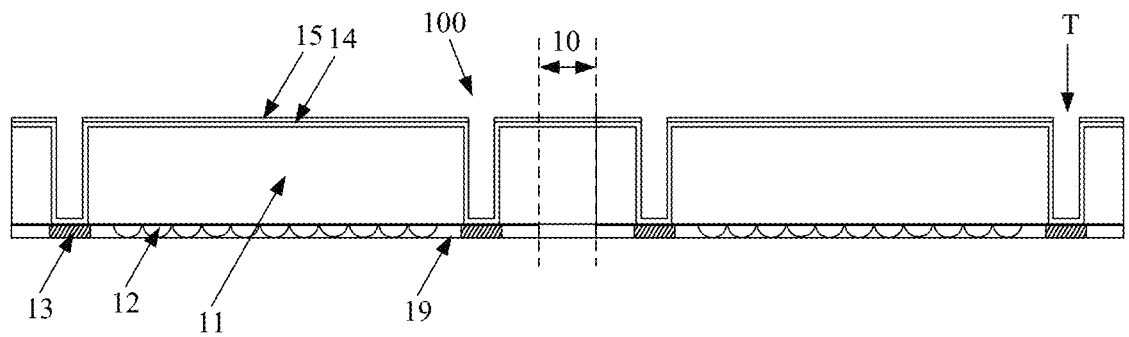

In step S14, as shown in FIG. 5, a second insulating layer 15 is formed, where the second insulating layer 15 covers the first insulating layer 14 outside the through hole T.

The bottom and the sidewall of the through hole T are only covered with the first insulating layer 14. The second insulating layer 15 may be formed by a deposition process. In an embodiment, the second insulating layer 15 may be a silicon nitride layer, which is more stable than the silicon dioxide layer and thus can effectively protect the first insulating layer 14.

Figure 6:
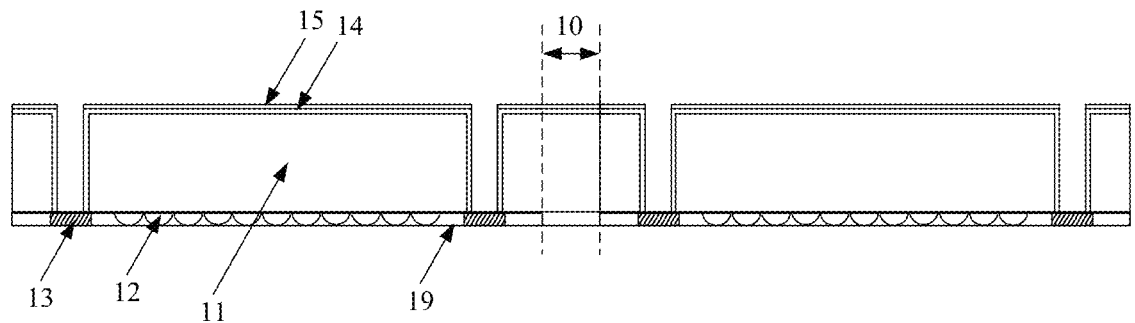

In step S15, as shown in FIG. 6, the first insulating layer 14 at the bottom of the through hole T is removed by an etching process, to expose the contact pad 13.

After performing the etching process on the first insulating layer 14 at the bottom of the through hole T, the contact pad 13 is exposed. By this time, the second insulating layer 15 outside the through hole T is only partially etched in the thick direction. It may be designed that a thickness of the second insulating layer 15 is greater than a preset value or an etching speed for the second insulating layer 15 is less than an etching speed for the first insulating layer 14 under the same etching conditions, so that the second insulating layer 15 outside the through hole T is only partially etched after the first insulating layer 14 at the bottom of the through hole T is fully etched.

In the embodiment of the present disclosure, the substrate 100 is a wafer. The wafer includes multiple chip regions 11. A cut groove 10 is provided between adjacent chip regions. The functional unit 12 and the contact pad are provided in each of the chip regions 11. In this case, the manufacture method further includes steps S16 to S18.

Figure 7:
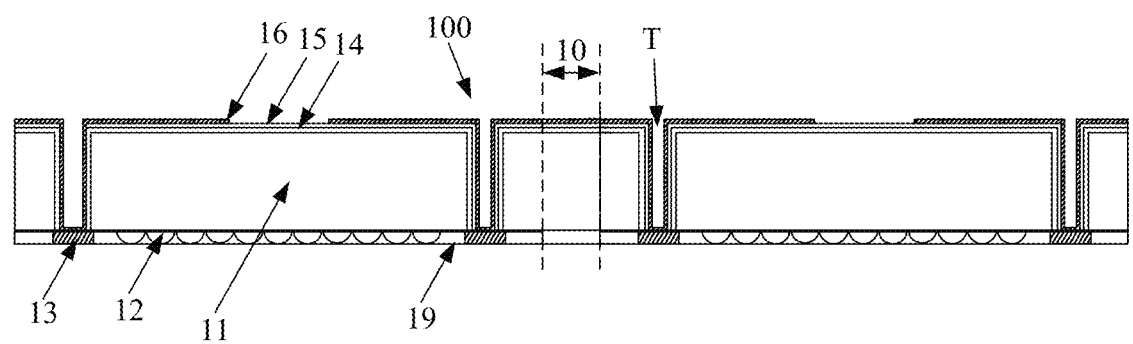

In step S16, as shown in FIG. 7, a rewiring layer 16 that covers the second insulating layer 15 is formed after performing the etching process, where the rewiring layer 16 is connected to the contact pad 13 at the bottom of the though hole T.

Figure 8:
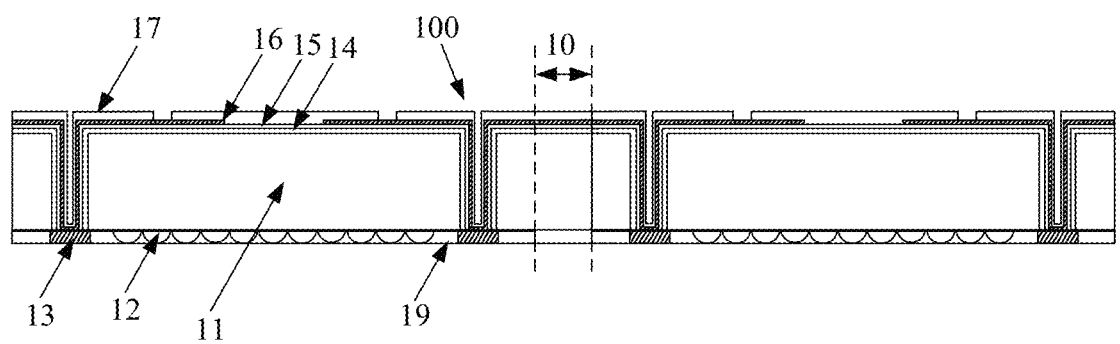

In step S17, as shown in FIG. 8, a solder mask 17 is formed on a surface of the rewiring layer 16, where the solder mask 17 has an opening in a region outside the through hole, and the rewiring layer 16 is exposed through the opening.

Figure 9:
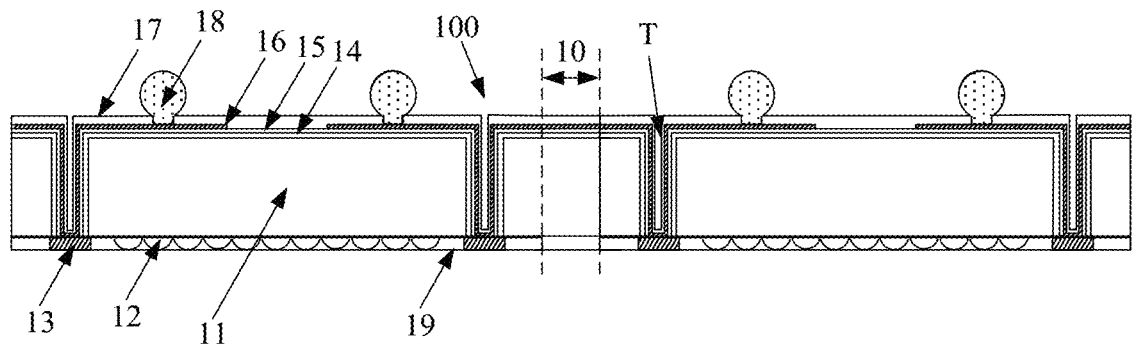

In step S18, as shown in FIG. 9, a connecting end 18 is formed at the opening, where the connecting end 18 is connected to the rewiring layer 16 and is for connecting to an external circuit.

The connecting end 18 may be a solder ball, a contact plate, a contact pad, a metal projection, or the like.

Figure 10:
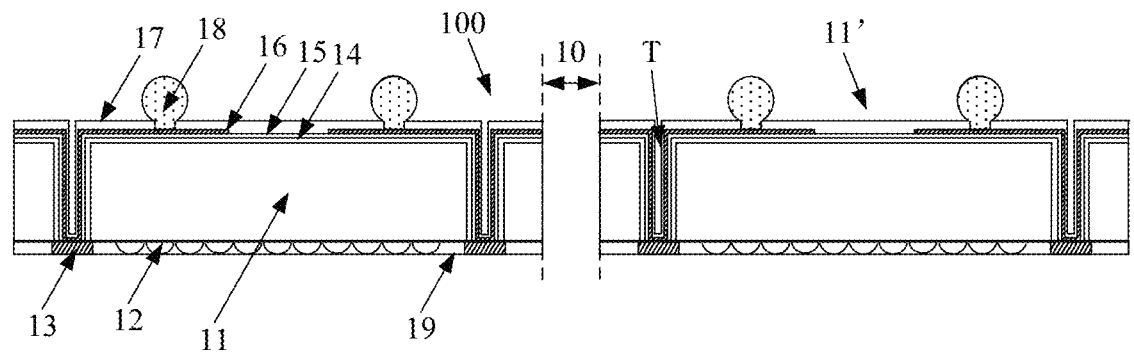

In step S18, as shown in FIG. 10, the wafer 100 is cut along the cut groove 10 to form multiple individual semiconductor devices 11'. After cutting the wafer 100, each of the chip regions 11 forms a corresponding semiconductor device 11'.

In the manufacture method of the embodiment of the present disclosure, a coverage rate for depositing the first insulating layer 14 is greater than a coverage rate for depositing the second insulating layer 15, such that the first insulating layer 14 covers the sidewall and the bottom of the through hole T and the back surface 112 of the substrate 100 outside the through hole T, while the second insulating layer 15 only covers the first insulating layer 14 outside the through hole T. Since the two insulating layers have a coverage rate difference, an aperture of the through hole T is decreased, such that it is impossible to form the second insulating layer 15 in the through hole with a low coverage rate, after forming the first insulating layer 14. In this case, the second insulating layer 15 only covers the first insulating layer 14 outside the through hole T, to form a composite layer of the first insulating layer 14 and the second insulating layer 15 only on the surface outside the through hole T. In this way, in the etching process, the first insulating layer 14 at the bottom of the through hole T can be fully etched by increasing the etching time, while the first insulating layer 14 outside the through hole T can be protected by the second insulating layer 15 from being over-etched. Due to the high coverage rate, the first insulating layer 14 at the bottom and the sidewall of the through hole T is thickened. In this case, although the etching time becomes longer, the etching speed for the first insulating layer at the bottom of the through hole T is much greater than that for the first insulating layer on the sidewall of the through hole T because of the etching direction of top-down (for example, a plasma etching process may be performed), thereby avoiding over-etching of the first insulating layer 14 on the sidewall of through hole T while fully etching the first insulating layer 14 at the bottom of the through hole T. Therefore, the reliability of the semiconductor device is improved.

According to the above description, in the manufacture method of the embodiment of the present disclosure, the first insulating layer may be made of silicon dioxide. The silicon dioxide is deposited with a high coverage rate to form the first insulating layer. In this case, the thick silicon dioxide layer is formed at the bottom of the through hole, as well as the sidewall of the through hole. Then a silicon nitride layer is deposited on a surface of the silicon dioxide layer outside the through hole to form the second insulating layer. Although the etching time for the silicon dioxide layer at the bottom of the through hole is prolonged, the insulating layer on the sidewall of the through hole and outside the through hole will not be damaged, thus improving the reliability of the devices.

Figure 11:
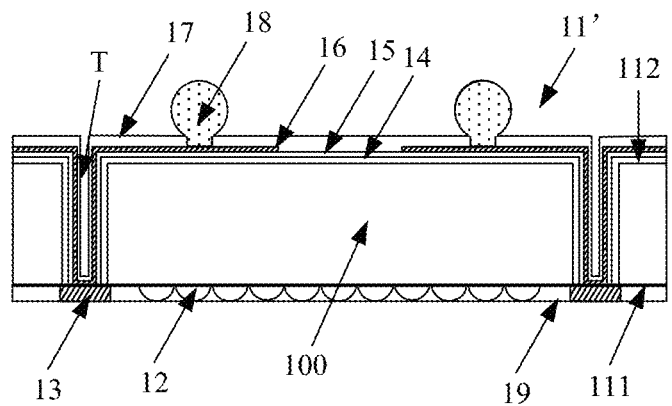
FIG. 11 is a schematic structural diagram of a semiconductor device according to an embodiment of the present disclosure.

Based on the above embodiments, a semiconductor device is further provided according to another embodiment of the present disclosure. FIG. 11 is a schematic structural diagram of the semiconductor device according to the embodiment of the present disclosure. The semiconductor device 11' includes a substrate 100. The substrate 100 includes a front surface 111 and a back surface 112 opposite to each other. A functional unit 12 and a contact pad 13 connected to the functional unit 12 are arranged on the front surface. A through hole T is formed on the back surface 112 of the substrate 100, where the contact pad 13 is exposed through the through hole T. A first insulating layer 14 covers the back surface 112 of the substrate 100 and covers all sidewall of the through hole T. The contact pad 13 at the bottom of the through hole T is exposed from the first insulating layer 14. A second insulating layer 15 covers the first insulating layer 14 outside the through hole. A rewiring layer 16 covers the second insulating layer 15. The rewiring layer 16 is connected to the contact pad 13 at the bottom of the through hole T. A solder mask 17 covers the rewiring layer 16. The solder mask 17 has an opening in a region outside the through hole T, and the rewiring layer 16 is exposed through the opening. A connecting end 18 is arranged at the opening. The connecting end 18 is connected to the rewiring layer 16 and is for connecting to an external circuit.

In an embodiment, the first insulating layer 14 and the second insulating layer 15 are formed by deposition processes. A coverage rate for depositing the first insulating layer is greater than a coverage rate for depositing the second insulating layer. The first insulating layer 14 is a silicon dioxide layer, and the second insulating layer 15 is a silicon nitride layer. The through hole T is a straight hole. A width of the through hole T is invariant in a direction perpendicular to the substrate 100. In an example, the through hole is a circular hole or a square hole. The semiconductor device is a photo-sensitive chip, an Application Specific Integrated Circuit (ASIC) chip or a micro-electromechanical system (MEMS) chip.

In the semiconductor device of the embodiment of the present disclosure, by forming the second insulating layer 15 on the surface of the first insulating layer 14, the first insulating layer 14 on the sidewall of the through hole T and outside the through hole T can be protected from being over-etched when manufacturing the semiconductor device, which improves the reliability of the semiconductor device.

It should be noted that the embodiments in the specification are described in a progressive manner, with the emphasis of each of the embodiments on the difference from other embodiments. For the same or similar parts between the embodiments, reference may be made one to another. Since the semiconductor devices disclosed in the embodiments corresponds to the method disclosed in the embodiment, the description for the semiconductor devices is simple, and reference may be made to the method embodiment for the relevant parts.

With the above description of the embodiments, those skilled in the art can implement or use the present disclosure. Multiple modifications to these embodiments are apparent to those skilled in the art, and the general principle defined herein may be implemented in other embodiments without deviating from the spirit or scope of the present disclosure. Therefore, the present disclosure is not limited to these embodiments described herein, and conforms to the widest scope consistent with the principle and novel features disclosed herein.

The invention claimed is:

1. A manufacture method of a semiconductor device, comprising:
    providing a substrate, wherein the substrate has a front surface and a back surface opposite to each other, a functional unit and a contact pad connected to the functional unit are arranged on the front surface;
    forming a through hole on the back surface of the substrate, wherein the contact pad is exposed through the through hole, and the through hole is a straight hole;
    forming a first insulating layer, wherein the first insulating layer covers the bottom and all sidewall of the through hole and the back surface of the substrate outside the through hole;
    forming a second insulating layer, wherein the second insulting layer covers the first insulating layer outside the through hole; and
    removing the first insulating layer at the bottom of the through hole by an etching process to expose the contact pad.

2. The manufacture method according to claim 1, wherein the forming a first insulating layer comprises forming the first insulating layer by a first deposition process; and
    the forming a second insulating layer comprises forming the second insulating layer by a second deposition process.

3. The manufacture method according to claim 2, wherein a coverage rate of the first deposition process is greater than a coverage rate of the second deposition process.

4. The manufacture method according to claim 1, wherein the first insulating layer is a silicon dioxide layer, and the second insulating layer is a silicon nitride layer.

5. The manufacture method according to claim 1, wherein the through hole is a circular hole or a square hole.

6. The manufacture method according to claim 1, wherein the first insulating layer is etched by a dry etching process or a wet etching process.

7. The manufacture method according to claim 1, wherein the substrate is a wafer, the wafer comprises a plurality of chip regions, a cut groove is provided between adjacent chip regions, the functional unit and the contact pad are arranged in each of the chip regions, and the manufacture method further comprises:
  forming a rewiring layer that covers the second insulating layer after performing the etching process, wherein the rewiring layer is connected to the contact pad at the bottom of the through hole;
  forming a solder mask on a surface of the rewiring layer, wherein the solder mask has an opening in a region outside the through hole, and the rewiring layer is exposed through the opening;
  forming a connecting end at the opening, wherein the connecting end is connected to the rewiring layer and is for connecting to an external circuit; and
  cutting the wafer along the cut groove to form a plurality of individual semiconductor devices.

8. A semiconductor device, comprising:
  a substrate, wherein the substrate comprises a front surface and a back surface opposite to each other, a functional unit and a contact pad connected to the functional unit are arranged on the front surface;
  a through hole arranged on the back surface of the substrate, wherein the contact pad is exposed through the through hole, and the through hole is a straight hole;
  a first insulating layer that covers the back surface of the substrate and covers all sidewall of the through hole, wherein the contact pad at the bottom of the through hole is exposed from the first insulating layer;
  a second insulating layer that covers the first insulating layer outside the through hole;
  a rewiring layer that covers the second insulating layer, wherein the rewiring layer is connected to the contact pad at the bottom of the through hole;
  a solder mask that covers the rewiring layer, wherein the solder mask has an opening in a region outside the through hole, and the rewiring layer is exposed through the opening; and
  a connecting end arranged at the opening, wherein the connecting end is connected to the rewiring layer and is for connecting to an external circuit.

9. The semiconductor device according to claim 8, wherein the first insulating layer is forming by a first deposition process, and the second insulating layer is formed by a second deposition process.

10. The semiconductor device according to claim 9, wherein a coverage rate of the first deposition process is greater than a coverage rate of the second deposition process.

11. The semiconductor device according to claim 8, wherein the first insulating layer is a silicon dioxide layer, and the second insulating layer is a silicon nitride layer.

12. The semiconductor device according to claim 8, wherein the through hole is a circular hole or a square hole.

13. The semiconductor device according to claim 8, wherein the semiconductor device is a photo-sensitive chip, an Application Specific Integrated Circuit (ASIC) chip or a micro-electromechanical system (MEMS) chip.

* * * * *